United States Patent
Matsunaga

(10) Patent No.: US 10,129,981 B2
(45) Date of Patent: Nov. 13, 2018

(54) ELECTRONIC COMPONENT MOUNTING SUBSTRATE, MOTOR, AIR-CONDITIONING APPARATUS, AND METHOD FOR MANUFACTURING THE ELECTRONIC COMPONENT MOUNTING SUBSTRATE

(71) Applicant: Mitsubishi Electric Corporation, Tokyo (JP)

(72) Inventor: Noriaki Matsunaga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 322 days.

(21) Appl. No.: 14/872,185

(22) Filed: Oct. 1, 2015

(65) Prior Publication Data

US 2016/0128195 A1 May 5, 2016

(30) Foreign Application Priority Data

Oct. 30, 2014 (JP) .................. 2014-221115

(51) Int. Cl.
*H05K 1/18* (2006.01)
*H05K 1/05* (2006.01)
(Continued)

(52) U.S. Cl.
CPC ......... *H05K 1/181* (2013.01); *H01L 23/3121* (2013.01); *H01L 23/3135* (2013.01);
(Continued)

(58) Field of Classification Search
CPC ........ H05K 1/181; H05K 1/053; H05K 3/303; H02K 11/30
(Continued)

(56) References Cited

U.S. PATENT DOCUMENTS 4,974,057 A * 11/1990 Tazima ............... H01L 23/3135
174/536
6,013,109 A * 1/2000 Choi ................... H01L 23/3135
257/E23.126
(Continued)

FOREIGN PATENT DOCUMENTS

| CN | 101770958 A | 7/2010 |
| CN | 102434466 A | 5/2012 |

(Continued)

OTHER PUBLICATIONS

English translation of JP 2012-034533, accessed Oct. 18, 2017 from JPO website, <https://www4.j-platpat.inpit.go.jp/cgi-bin/tran_web_cgi_ejje?u=http://www4.j-platpat.inpit.go.jp/eng/translation/201710190312125348261242204619902538 07A4538AA0D69755245E9BF026E9F>.*

(Continued)

*Primary Examiner* — Jeremy Luks
(74) *Attorney, Agent, or Firm* — Posz Law Group, PLC

(57) ABSTRACT

An electronic component mounting substrate includes an electronic component mounted on a surface of a substrate, an electrode portion disposed on the surface of the substrate and electrically connected to the electronic component, a lead wire connected to the electrode portion, and an encapsulation resin configured to encapsulate a part of the lead wire, the electronic component, and the electrode portion. A surface of at least the part of the lead wire encapsulated by the encapsulation resin and the surface of the substrate are coated with a deposited film.

12 Claims, 12 Drawing Sheets

(51) Int. Cl.
*H02K 11/30* (2016.01)
*H05K 3/30* (2006.01)
*H01L 23/31* (2006.01)

(52) U.S. Cl.
CPC .............. *H02K 11/30* (2016.01); *H05K 1/053* (2013.01); *H05K 3/303* (2013.01); *H01L 2924/0002* (2013.01); *H05K 2201/1009* (2013.01)

(58) Field of Classification Search
USPC .......................................................... 310/45
See application file for complete search history.

(56) References Cited

U.S. PATENT DOCUMENTS

| | | | | |
|---|---|---|---|---|
| 7,777,352 | B2* | 8/2010 | Mahler | H01L 23/3142 257/666 |
| 2002/0127776 | A1 | 9/2002 | Nakajo et al. | |
| 2008/0074829 | A1* | 3/2008 | Kashiwazaki | H01L 23/4334 361/600 |
| 2010/0117224 | A1 | 5/2010 | McElrea et al. | |
| 2010/0164083 | A1 | 7/2010 | Yim | |
| 2012/0014078 | A1* | 1/2012 | Watanabe | H05K 7/1061 361/760 |
| 2014/0084452 | A1* | 3/2014 | Nagamatsu | H05K 1/053 257/734 |
| 2014/0182887 | A1* | 7/2014 | Yoshioka | G11B 5/486 174/250 |
| 2016/0029491 | A1* | 1/2016 | Tomohiro | H01L 25/105 361/767 |
| 2016/0050748 | A1* | 2/2016 | Usami | H01L 23/16 361/783 |

FOREIGN PATENT DOCUMENTS

| | | |
|---|---|---|
| JP | H02-148743 A | 6/1990 |
| JP | H06-312156 A | 11/1994 |
| JP | 2001-237254 A | 8/2001 |
| JP | 2002-270721 A | 9/2002 |
| JP | 2012-34533 A | 2/2012 |
| JP | 2014-082847 A | 5/2014 |

OTHER PUBLICATIONS

Communication Pursuant to Article 94(3) EPC dated Mar. 6, 2017 in the corresponding European patent application No. 15188718.9.
Office Action dated Feb. 14, 2017 in the corresponding Japanese patent application No. 2014-221115 (with English translation).
Office Action dated Aug. 29, 2017 issued in corresponding JP patent application No. 2014-22115 (and English translation).
Extended European Search Report dated Apr. 13, 2016 issued in corresponding EP patent application No. 15188718.9.
Office Action dated Jul. 24, 2017 issued in corresponding CN patent application No. 201510673962.8 (and English translation).
Office Action dated Feb. 12, 2018 issued in corresponding CN patent application No. 201510673962.8 (and English translation).

* cited by examiner

FIG. 5A
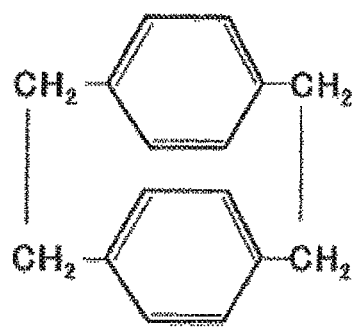
FIG. 5B
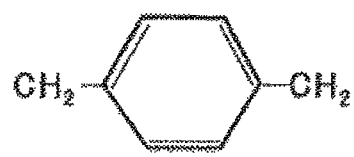
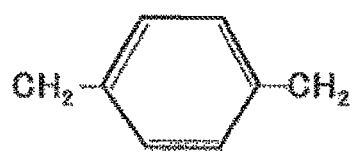
FIG. 5C
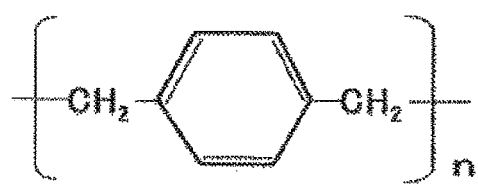

51-53: OUTPUT VOLTAGE OF HALL ELEMENT FOR EACH PHASE (DURING NORMAL OPERATION)

61-63: OUTPUT VOLTAGE OF HALL ELEMENT FOR EACH PHASE (DURING UNSTABLE OPERATION)

F I G. 12

| MATERIAL AND METHOD FOR FORMING COATING | COATING FILM THICKNESS | PREHEATING | | EVALUATION OF HALL ELEMENT OUTPUT AFTER IMMERSION TEST |
|---|---|---|---|---|
| | | TEMPERATURE | TIME | |
| POLY-PARA-CHLORO-XYLYLENE: DEPOSITION | 4μm | 120°C | 5 MINUTES | MALFUNCTION |
| POLY-PARA-CHLORO-XYLYLENE: DEPOSITION | 15μm | — | — | MALFUNCTION |
| POLY-PARA-CHLORO-XYLYLENE: DEPOSITION | 15μm | 50°C | 5 MINUTES | UNSTABLE |
| POLY-PARA-CHLORO-XYLYLENE: DEPOSITION | 15μm | 100°C | 5 MINUTES | NORMAL |
| POLY-PARA-CHLORO-XYLYLENE: DEPOSITION | 15μm | 120°C | 5 MINUTES | NORMAL |
| POLY-PARA-CHLORO-XYLYLENE: DEPOSITION | 15μm | 150°C | 5 MINUTES | UNSTABLE |
| LIQUID EPOXY RESIN: BRUSH COATING | 200μm | 120°C | 5 MINUTES | MALFUNCTION |
| LIQUID EPOXY RESIN: BRUSH COATING | 200μm | — | — | MALFUNCTION |

ELECTRONIC COMPONENT MOUNTING SUBSTRATE, MOTOR, AIR-CONDITIONING APPARATUS, AND METHOD FOR MANUFACTURING THE ELECTRONIC COMPONENT MOUNTING SUBSTRATE

TECHNICAL FIELD

The present invention relates to an electronic component mounting substrate, a motor including the electronic component mounting substrate, an air-conditioning apparatus including the motor, and a method for manufacturing the electronic component mounting substrate.

BACKGROUND ART

When a substrate having electronic components mounted thereon has the risk of being exposed to water, a resin coating has been conventionally applied to the surface of the substrate for protection against water and moisture. For example, Patent Literature 1 describes a technique that a part of a surface of the substrate having connecting portions of lead wires thereon is coated by applying a resin thereto (see, e.g., Paragraph [0044]). The substrate whose surface is partially coated is encapsulated in a resin by insert molding (see, e.g., Paragraph [0049] and FIG. 5). This configuration is designed to enhance waterproofness.

CITATION LIST

Patent Literature

Patent Literature 1: Japanese Unexamined Patent Application Publication No. 2012-34533

SUMMARY OF INVENTION

Technical Problem

In the configuration described in Patent Literature 1, water enters through gaps in the interface between the lead wires and a mold for resin encapsulation of the lead wires and the substrate. The water causes electronic components on the substrate to malfunction. For example, when a device including an electronic component mounting substrate is used in a high-humidity environment, moisture condensing on the outer surface of the mold penetrates into the encapsulation resin by capillarity through gaps formed in the interface between the lead wires and the encapsulation resin. If the penetrating moisture passes through gaps formed in the interface between the lead wires and a coating layer in the encapsulation resin and reaches the connecting portions on the substrate to which the lead wires are connected, the moisture causes corrosion of the connecting portions or a short circuit in a power supply. For example, if the electronic component mounting substrate is included in a motor, a short circuit in the power supply causes an electronic circuit on the substrate to malfunction and makes the motor uncontrollable.

Application of a liquid coating agent to the surface of the substrate, as in Patent Literature 1, has the following problem. That is, in a part of the surface of the substrate having substantial surface irregularities thereon because the connecting portions of the lead wires and the electronic components are mounted, gaps are formed by entry of air bubbles or poor distribution of the coating agent during formation of the coating layer. In the technique described in Patent Literature 1, the coating layer has a substantial thickness to prevent formation of gaps. However, this configuration has the following problem. For example, on the substrate for a DC brushless motor, Hall elements for detecting the magnetic force of a rotor are often mounted. Since the magnetic flux density decreases inversely proportional to distance, it is necessary to reduce the distance between the rotor and the Hall elements. If the coating layer on the surface of the substrate where the Hall elements are mounted is too thick, the magnetic strength of the motor cannot be correctly detected due to a large distance between the rotor and the Hall elements. As a result, the motor cannot be properly controlled.

Also, in the case of using the liquid coating agent, a uniform film thickness cannot be achieved due to surface tension. For example, the film thickness is extremely thin at an edge portion of a device, and such unevenness in film thickness causes increased residual stress. As a result, the film is easily cracked by application of external stress thereto.

The present invention has been made to solve the problems described above. An object of the present invention is to provide an electronic component mounting substrate capable of allowing devices to operate properly even in an environment that promotes adhesion of moisture, a motor including the electronic component mounting substrate, an air-conditioning apparatus including the motor, and a method for manufacturing the electronic component mounting substrate.

Solution to Problem

An electronic component mounting substrate according to the present invention includes an electronic component mounted on a surface of a substrate, an electrode portion disposed on the surface of the substrate and electrically connected to the electronic component, a lead wire connected to the electrode portion, and an encapsulation resin configured to encapsulate a part of the lead wire, the electronic component, and the electrode portion. A surface of at least the part of the lead wire encapsulated by the encapsulation resin and the surface of the substrate are coated with a deposited film.

A motor according to the present invention includes the electronic component mounting substrate. An air-conditioning apparatus according to the present invention includes the motor.

A method for manufacturing an electronic component mounting substrate according to the present invention includes preparing a substrate having an electronic component and an electrode portion mounted on a surface thereof, the electrode portion being electrically connected to the electronic component, the substrate being provided with a lead wire connected at one end thereof to the electrode portion, forming a deposited film on the surface of the substrate and a surface of the lead wire, and encapsulating the surface of the substrate and the surface of the lead wire in a resin.

Advantageous Effects of Invention

The electronic component mounting substrate according to the present invention is capable of allowing devices to operate properly even in an environment that promotes adhesion of moisture. The motor and the air-conditioning apparatus, each including the electronic component mounting substrate according to the present invention, are capable of operating properly even in an environment that promotes adhesion of moisture. The method for manufacturing the electronic component mounting substrate according to the present invention is capable of manufacturing the electronic component mounting substrate that operates properly even in an environment that promotes adhesion of moisture.

BRIEF DESCRIPTION OF DRAWINGS

FIG. 5A shows a chemical formula of di-para-xylylene vaporized in the first step of a deposited film forming process.

FIG. 5B shows a chemical formula of diradical-para-xylylene formed in the second step of the process.

FIG. 5C shows a chemical formula of poly-para-xylylene, which is a material of a deposited film formed in the third step of the process.

FIG. 12 shows a test result based on the waveforms in FIGS. 11A to 11C.

DESCRIPTION OF EMBODIMENTS

Embodiment 1

Figure 1:
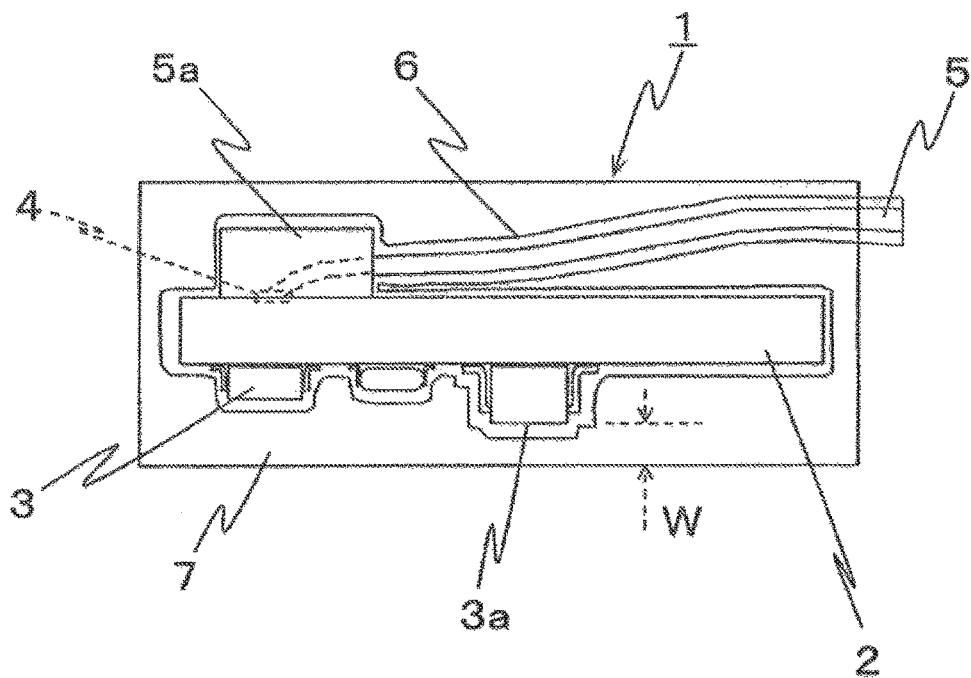
FIG. 1 is a cross-sectional schematic view of an electronic component mounting substrate according to Embodiment 1 of the present invention.
Figure 2:
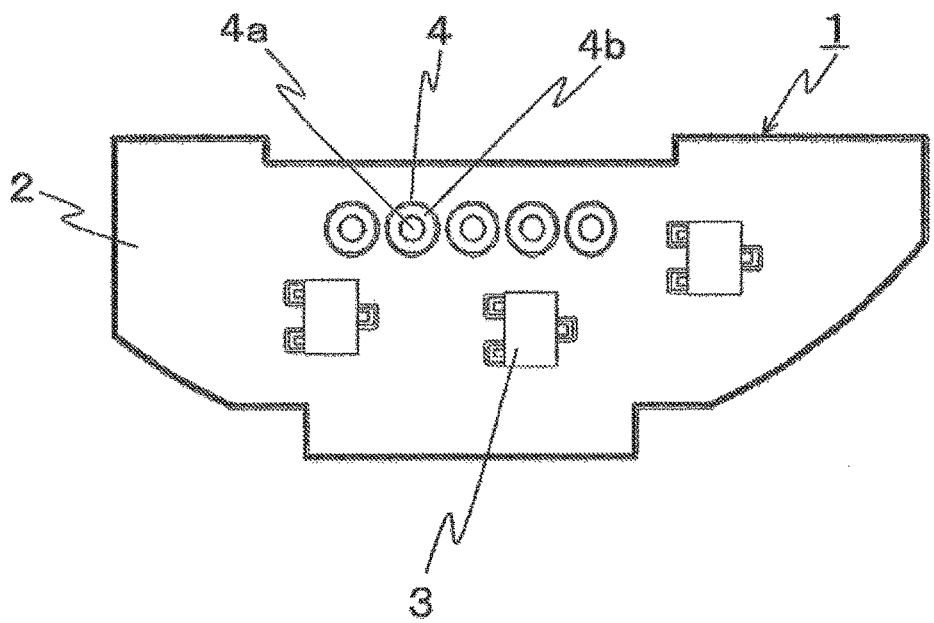
FIG. 2 is a plan view of a substrate having electronic components mounted thereon.
Figure 3:
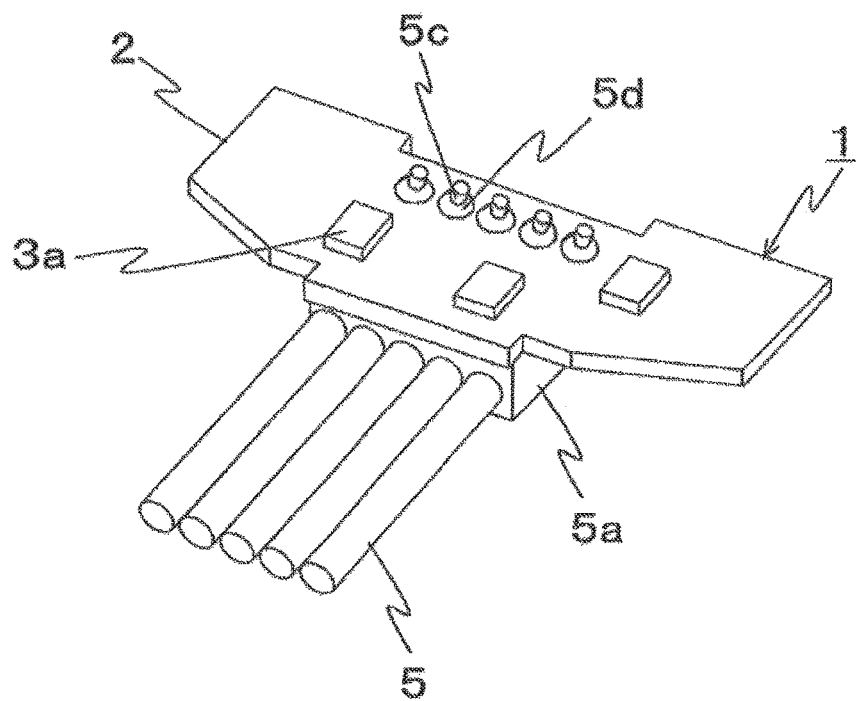
FIG. 3 is a perspective view of the substrate with lead wires connected thereto.

FIG. 1 is a cross-sectional schematic view of an electronic component mounting substrate 1 according to Embodiment 1. At least one electronic component 3 is mounted on the surface of a plate-like substrate 2. The at least one electronic component 3 is mounted on one or both sides of the substrate 2. In the example of FIGS. 1 to 3, more than one electronic component 3 is mounted on only one side of the substrate 2. For convenience, a surface having the electronic components 3 mounted thereon will be referred to as a component mounting surface. By conductive circuit wires (not shown) patterned on the surface of the substrate 2, the electronic components 3 can be connected to each other to form an electronic circuit (not shown). Electrode portions 4 are electrically connected to the electronic components 3 either directly or through the electronic circuit. A through hole 4a passing through the substrate 2 is formed in the center of each electrode portion 4. A metal foil pattern 4b made of metal, such as copper, is formed around the through hole 4a. An electrode-portion connection terminal 5c caulked or crimped onto one end of each lead wire 5 is inserted from a side opposite the component mounting surface into the corresponding through hole 4a and soldered to the metal foil pattern 4b of the electrode portion 4 on the component mounting surface. The one end of the lead wire 5 is electrically connected to the corresponding electrode portion 4 at a solder joint 5d. The one end of the lead wire 5 in the example of FIG. 1 is formed as a connector 5a. In the example of FIG. 1, one ends of a plurality of lead wires 5 are tied together to form the single connector 5a. The other ends of the lead wires 5 are connected to an external device, such as a power supply. A deposited film 6 is formed on the surface of the substrate 2 and the surface of each lead wire 5. The surfaces of the substrate 2, electronic components 3, electrode portions 4, solder joints 5d, and lead wires 5 are coated with the deposited film 6. When the one ends of the lead wires 5 are formed as the connector 5a, the connector 5a is also coated with the deposited film 6. When the connector 5a is provided and a gap of greater than or equal to the thickness of the deposited film 6 exists between the connector 5a and the substrate 2 and between the connector 5a and the lead wires 5, the surfaces of the electrode portions 4 and solder joints 5d are coated with the deposited film 6. A resin can be used as a material of the deposited film 6. The resin is preferably a poly-para-xylylene resin, which is preferably poly-para-chloro-xylylene.

The substrate 2, the electronic components 3, the electrode portions 4, and the lead wires 5 coated with the deposited film 6 are encapsulated by an encapsulation resin 7. When the one ends of the lead wires 5 are formed as the connector 5a as in the example of FIG. 1, the connector 5a is encapsulated by the encapsulation resin 7. When the connector 5a is not provided, the surface of the solder joints 5d is encapsulated by the encapsulation resin 7. The surface of at least a part of each lead wire 5, the part being encapsulated by the encapsulation resin 7, is entirely coated with the deposited film 6. BMC unsaturated polyester, for example, can be used as a material of the encapsulation resin 7. The thickness of the deposited film 6 preferably ranges from 5 μm to 150 μm. The total thickness W of both the deposited film 6 and the encapsulation resin 7 on each electronic component 3 preferably ranges from 15 μm to 1 mm. With this thickness, when a measuring element, such as a Hall element 3a, is mounted as the electronic component 3, a small distance between the measuring element and an object to be measured can be achieved, and measurement accuracy can be improved.

Figure 4:
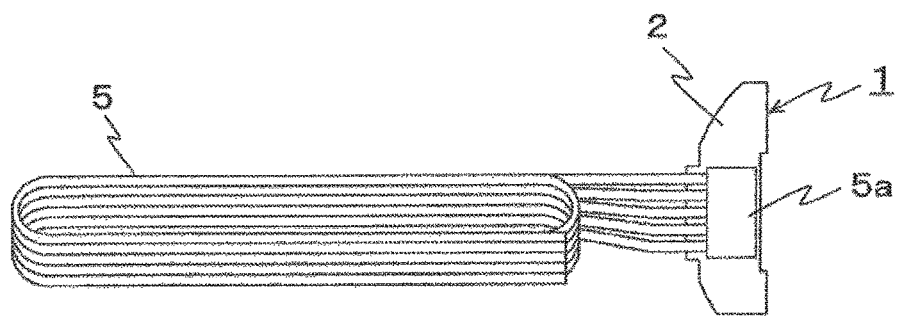
FIG. 4 is a perspective view of the lead wires in a folded state.
Figure 6A:
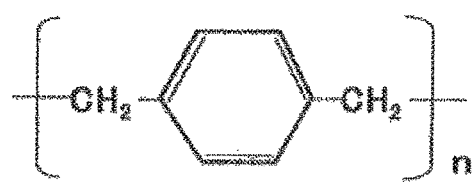
FIG. 6A shows a chemical formula of poly-para-xylylene.
Figure 6B:
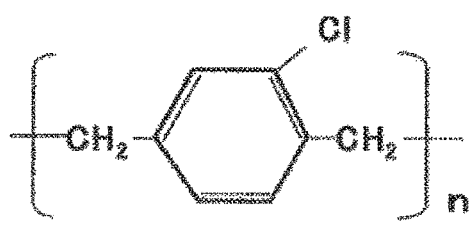
FIG. 6B shows a chemical formula of poly-para-xylylene.
Figure 6C:
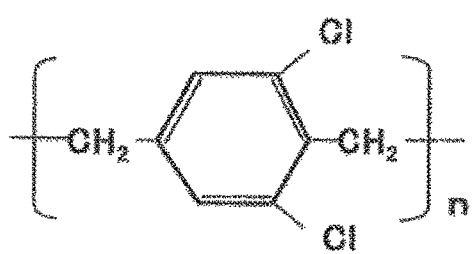
FIG. 6C shows a chemical formula of poly-para-xylylene.
Figure 6D:
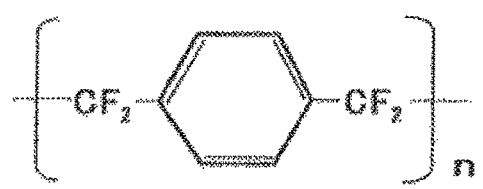
FIG. 6D shows a chemical formula of poly-para-xylylene.
Figure 6E:
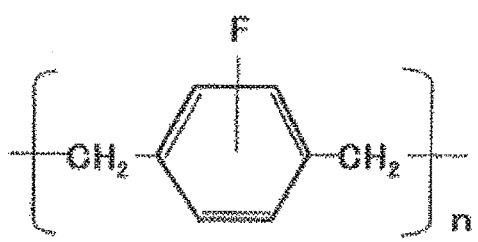
FIG. 6E shows a chemical formula of poly-para-xylylene.
Figure 6F:
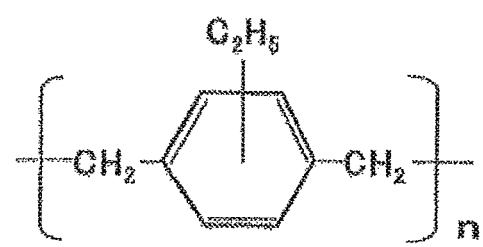
FIG. 6F shows a chemical formula of poly-para-xylylene.
Figure 7:
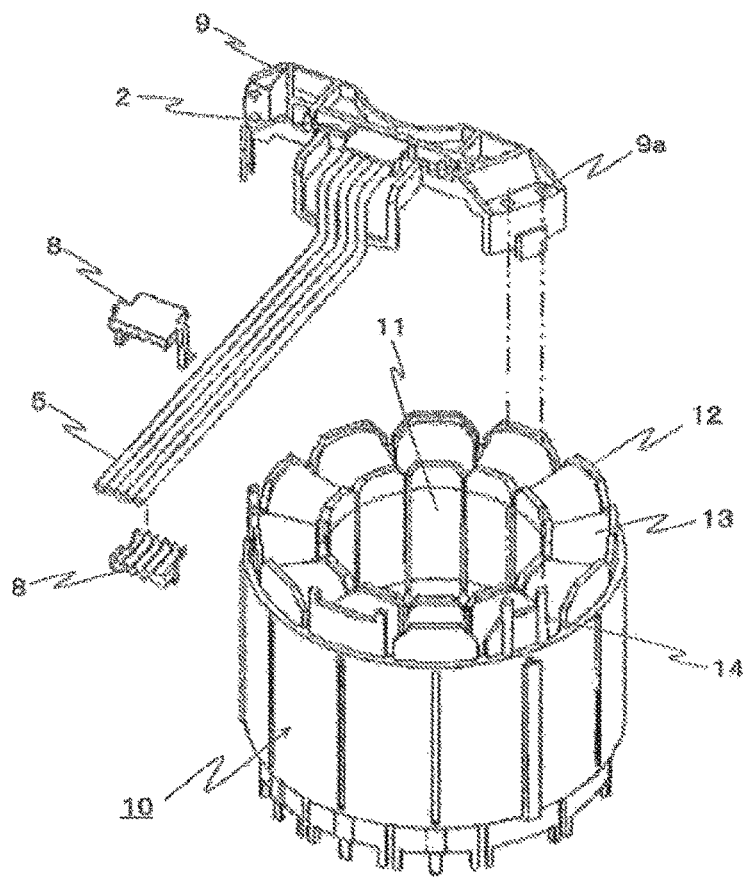
FIG. 7 is a perspective view illustrating a substrate fixing member with the substrate fixed thereto, and a stator that is to be joined with the substrate fixing member.
Figure 8:
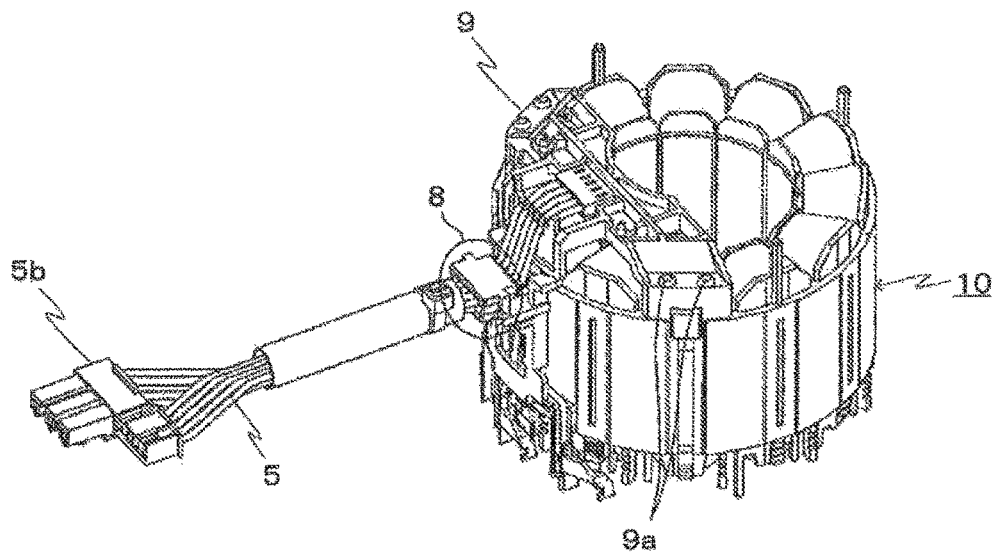
FIG. 8 is a perspective view illustrating the stator of a motor including the substrate.
Figure 9A:
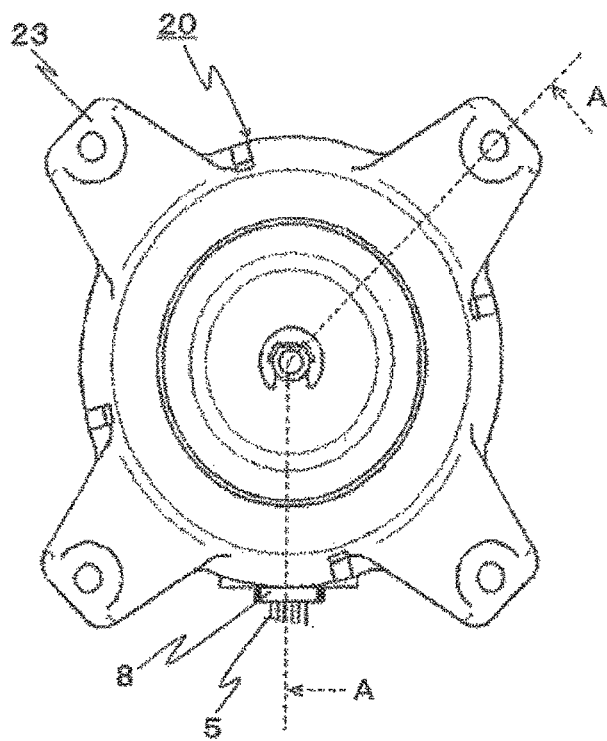
FIG. 9A is a front view of the motor formed by encapsulating the stator of FIG. 8 in a resin.
Figure 9B:
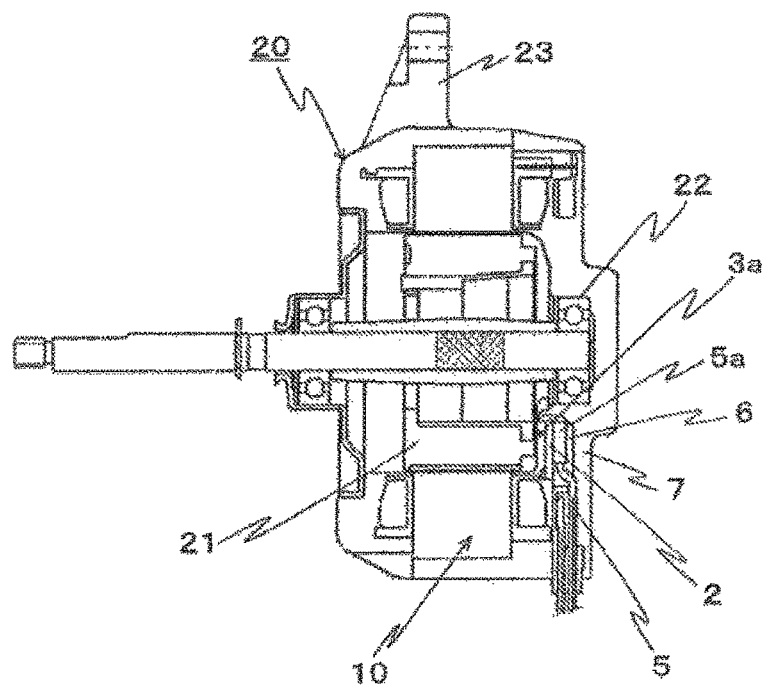
FIG. 9B is a cross-sectional schematic view taken along line A-A of FIG. 9A.

A method for manufacturing a stator 10 of a motor 20 including the electronic component mounting substrate 1 will be described with reference to FIGS. 2 to 9. FIG. 2 is a plan view of the substrate 2 having the electronic components 3 mounted thereon. FIG. 3 is a perspective view of the substrate 2 with the lead wires 5 connected thereto. FIG. 4 is a perspective view of the lead wires 5 in a folded state. FIGS. 5A to 5C show chemical formulas of materials in the process of forming the deposited film 6. FIGS. 6A to 6F show chemical formulas of poly-para-xylylene. FIG. 7 is a perspective view illustrating a substrate fixing member 9 with the substrate 2 fixed thereto, and the stator 10, which is to be joined with the substrate fixing member 9. FIG. 8 is a perspective view illustrating the stator 10 of the motor 20 including the substrate 2. FIG. 9A is a front view of a motor 20 formed by encapsulating the stator 10 in a resin. FIG. 9B is a cross-sectional schematic view taken along line A-A of FIG. 9A.

First, the substrate 2 illustrated in FIG. 2 is prepared. The electronic components 3 are mounted on the surface of the substrate 2. The electronic components 3 and electrical wires (not shown) on the substrate 2 form an electronic circuit (not shown). The electrode portions 4 are disposed on the surface of the substrate 2. The electrode portions 4 are electrically connected to the electronic components 3 either directly or through the electronic circuit.

Next, as illustrated in FIG. 3, one ends of the lead wires 5 are connected to the electrode portions 4 on the substrate 2. In the example of FIG. 3, the one ends of the lead wires 5 are formed as the connector 5a. For controlling a rotor 21 of the motor 20, the Hall elements 3a, which detect the magnetism of the rotor 21, are mounted on the component mounting surface. The motor 20 of Embodiment 1 is a three-phase induction motor. Three Hall elements 3a corresponding to the respective phases are mounted on the substrate 2.

With the lead wires 5 folded as illustrated in FIG. 4, the substrate 2 is placed in a vacuum furnace (not shown), and a resin such as para-xylylene is deposited onto the surface of the substrate 2, electronic components 3, electrode portions 4, solder joints 5d, and lead wires 5 by a typical vacuum deposition method. When the one ends of the lead wires 5 are formed as the connector 5a, the deposited film 6 is formed on the surface of the connector 5a. When the connector 5a is provided and a gap of greater than or equal to the thickness of the deposited film 6 exists between the connector 5a and the substrate 2 and between the connector 5a and the lead wires 5, the deposited film 6 is formed on the surfaces of the electrode portions 4 and solder joints 5d. Although the substrate 2, the electronic components 3, the electrode portions 4, and the lead wires 5 are encapsulated by the encapsulation resin 7 in a subsequent step, the surface of at least a part of each lead wire 5 to be encapsulated by the encapsulation resin 7 is entirely coated with the deposited film 6 by the deposition processing. When the substrate 2 is placed in the vacuum furnace, the lead wires 5 are folded for compactness. This compactness can improve efficiency in the loading of the substrate 2 into the vacuum furnace in batch processing of vacuum deposition, and thus can improve productivity.

The structure of the para-xylylene resin deposited in Embodiment 1 and the method for manufacturing the para-xylylene resin are publicly known. The deposition involves the following three steps. The first step is the step of vaporizing di-para-xylylene that is a solid dimer shown in FIG. 5A at about 100 degrees C. to about 200 degrees C. The second step is the step of breaking the methylene bonds of the dimer, as shown in FIG. 5B, by pyrolysis at about 450 degrees C. to about 700 degrees C. to form monomeric diradical-para-xylylene molecules. The third step is the step of guiding vapors of monomeric diradical-para-xylylene, shown in FIG. 5C, into a vacuum chamber where an object to be coated is placed and the degree of vacuum is kept at about 0.1 Torr (13 Pa) at room temperature, and allowing the vapors to be reactively polymerized on the object to form a coating film of poly-para-xylylene. The poly-para-xylylene is defined by the chemical formulas shown in FIGS. 6A to 6F (where n is 5000 or more). Para-chloro-xylylene described below is obtained by replacing one of hydrogen atoms in benzene rings in FIGS. 5A to 5C by a chlorine atom.

Next, the folded lead wires 5 are straightened as illustrated in FIG. 7, and the coating of the other ends of the lead wires 5 is removed. After the removal of the coating of the other ends, an external connection terminal 5b (see FIG. 8) for connecting to an external power supply or control device (not shown) is connected to the lead wires 5. Next, the substrate 2 is fixed to the substrate fixing member 9, with its surface having the Hall elements 3a thereon facing toward the stator 10 of the motor 20. In the stator 10, stator cores 11 are each wound by a winding 13, with an insulator 12 interposed therebetween, and are coupled together in a cylindrical shape. Protrusions 14 are integrally formed with the insulators 12.

Next, as illustrated in FIG. 8, the protrusions 14 of the stator 10 are inserted into the corresponding hole portions 9a of the substrate fixing member 9 and welded in place. Next, a lead bushing 8 is attached to the lead wires 5 from both the upper and lower sides to tie the lead wires 5 together. Polyethylene terephthalate (PET), polybutylene terephthalate (PBT), polyamide (PA), for example, can be used as a material of the lead bushing 8. Hereinafter, the stator 10 with the lead wires 5 obtained by the process described above will be referred to as a lead-wire attached stator 10a. As described above, the lead wires 5 are tied together by the lead bushing 8. Thus, when the lead-wire attached stator 10a is inserted into a mold (not shown) and encapsulated by the encapsulation resin 7 in a subsequent step, the encapsulation resin 7 can be prevented from leaking through gaps between the lead wires 5 and the mold.

Next, the lead-wire attached stator 10a of the motor 20 assembled in the process described above is preheated in the air. The lead-wire attached stator 10a is then inserted into the mold (not shown). Next, a resin is injected into the mold heated to a predetermined temperature and then cured. The thermosetting resin is, for example, an unsaturated polyester resin. By the processing described above, the lead-wire attached stator 10a is encapsulated by the encapsulation resin 7. Hereinafter, the structure obtained by the encapsulation will be referred to as a molded stator 10b. Generally, a thermosetting resin is not sufficiently cured when an object to be inserted into the mold has a low temperature. By preheating the object to be inserted, the resin can be cured sufficiently. Also, by preheating the lead-wire attached stator 10a, the strength of the deposited film 6 applied to the surfaces of the substrate 2 and lead wires 5 can also be improved.

Next, as illustrated in FIGS. 9A and 9B, a bearing 22 is attached to the rotor 21, which is assembled to the molded stator 10b to form the motor 20 including the electronic component mounting substrate 1. The motor 20 has mounting feet 23 for mounting the motor 20, for example, in an outdoor unit of an air-conditioning apparatus. The lead bushing 8 is partly exposed from the outer periphery of the encapsulation resin 7. The lead wires 5 are partly encapsulated in the encapsulation resin 7, and the remaining parts of the lead wires 5 extend to the outside of the encapsulation resin 7.

Figure 11A:
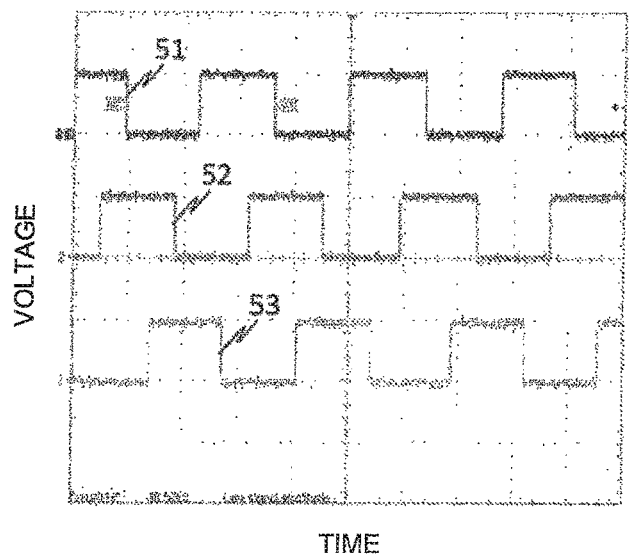
FIG. 11A shows waveforms of Hall element output voltages obtained by testing the motor after immersion in the immersion apparatus of FIG. 10 when the electronic component mounting substrate is operating properly.
Figure 11B:
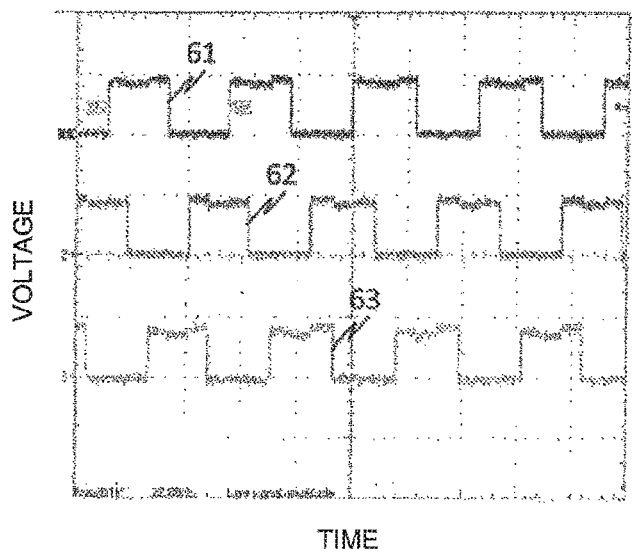
FIG. 11B shows waveforms of Hall element output voltages obtained by testing the motor after immersion in the immersion apparatus of FIG. 10 when the operation of the electronic component mounting substrate is unstable.
Figure 11C:
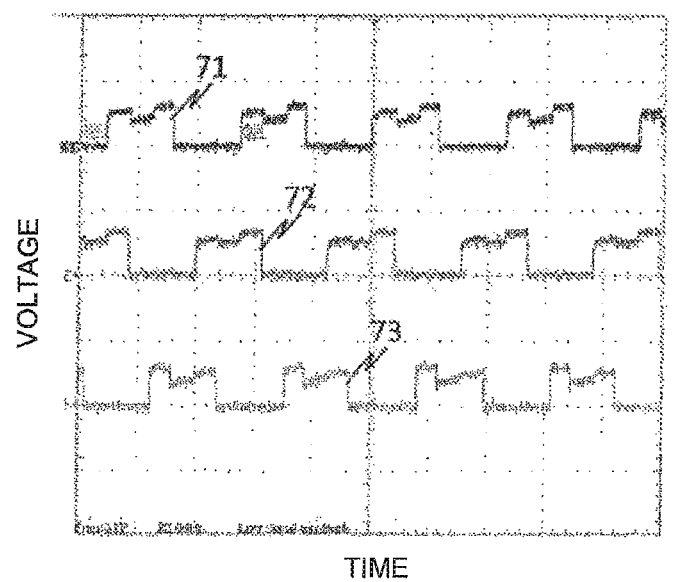
FIG. 11C shows waveforms of Hall element output voltages obtained by testing the motor after immersion in the immersion apparatus of FIG. 10 when the operation of the electronic component mounting substrate is out of control.

The Hall elements 3a that detect the magnetism of the rotor 21 for controlling the rotor 21 are disposed close to the rotor 21. The rotor 21 rotates when power is supplied to the windings 13 of the stator 10. The Hall elements 3a are capable of detecting the magnetism produced by rotation of the rotor 21. Temporal changes in the magnitude of the detected magnetism are output, through the lead wires 5, in waveforms as shown in FIGS. 11A to 11C described below. Observing the waveforms allows a determination of whether the Hall elements 3a are operating properly.

For example, when the motor 20 including the electronic component mounting substrate 1 is used in a high-humidity environment, moisture condensing on the outer surface of the encapsulation resin 7 may penetrate into the encapsulation resin 7 by capillarity, through gaps formed in the interface between the lead bushing 8 and the encapsulation resin 7 and gaps between portions of laminated steel sheets exposed from an inner unsaturated polyester portion of the stator 10. If the penetrating moisture reaches the electronic component mounting substrate 1, the resulting short circuit in the power supply may make the Hall elements 3a unable to properly perform magnetic detection and may make the motor 20 uncontrollable. It takes a substantial amount of time for moisture to reach the electronic component mounting substrate 1 by capillarity. An immersion apparatus 30 illustrated in FIG. 10 is thus used to allow moisture to reach the electronic component mounting substrate 1 in a short time.

Figure 10:
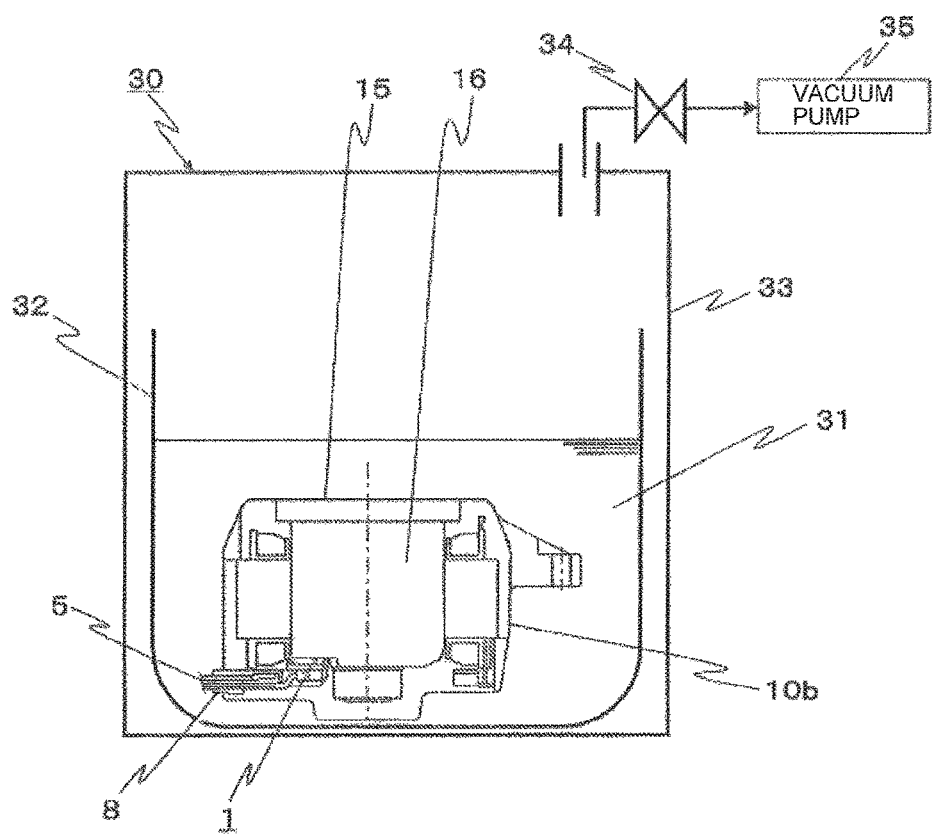
FIG. 10 illustrates an immersion apparatus for testing the motor illustrated in FIG. 9A.

FIG. 10 illustrates the immersion apparatus 30 for accelerating penetration of moisture into the encapsulation resin 7 of the motor 20. Moisture penetration acceleration processing performed using the immersion apparatus 30 will be described.

First, a container 32 containing an electrolytic solution 31 is prepared. Next, the molded stator 10b is immersed in the electrolytic solution 31 with an inner opening 15 of the molded stator 10b facing upward. At this point, the molded stator 10b is entirely immersed in the electrolytic solution 31. For example, a 0.5% saline solution can be used as the electrolytic solution 31. Next, the container 32 containing the molded stator 10b and the electrolytic solution 31 is placed in a vacuum desiccator 33. Then, a vacuum in the vacuum desiccator 33 is drawn by a vacuum pump 35 through a valve 34. For example, the vacuum desiccator 33 is left standing still for an hour with the degree of vacuum therein kept at 4 Torr or less.

Hereinafter, a test for checking the operation of the Hall elements 3a in the electronic component mounting substrate 1 included in the molded stator 10b will be described.

After the molded stator 10b is taken out of the container 32, the electrolytic solution 31 retained in an inner cylindrical portion 16 is removed, and the rotor 21 (see FIG. 9B) is assembled into the inner cylindrical portion 16. Next, the external connection terminal 5b of the lead wires 5 (see FIG. 8) is connected to the external power supply (not shown) to apply a rotating magnetic field to the stator 10 (see FIG. 7) in the molded stator 10b. When the rotor 21 rotates, rectangular waveforms 51 to 53, 61 to 63, and 71 to 73 of Hall element output voltages, as in FIGS. 11A to 11C, are output through the lead wires 5. As shown, the voltage alternates between high and low levels for each of the three phases. In FIGS. 11A to 11C, the vertical axis represents voltage and the horizontal axis represents time. When the deposited film 6 in the electronic component mounting substrate 1 is free from pinhole defects and damage during resin encapsulation, and thus resulting in no problem such as a short circuit in the power supply caused by moisture penetration, the waveforms 51 to 53 with flat high-voltage portions are output as shown in FIG. 11A. Hereinafter, the operation performed when the waveforms shown in FIG. 11A are obtained will be referred to as a normal operation. If any defect or damage described above occurs, results in a problem such as a short circuit in the power supply caused by moisture penetration, and makes the operation unstable, the waveforms 61 to 63 with fluctuating high-voltage portions are output as shown in FIG. 11B. Hereinafter, the operation performed when the waveforms shown in FIG. 11B are obtained will be referred to as an unstable operation. If the level of the problem caused by moisture penetration is high and the rotor 21 is in an uncontrollable state, the waveforms 71 to 73 with more fluctuating high-voltage portions are output as shown in FIG. 11C. Hereinafter, the operation performed when the waveforms shown in FIG. 11C are obtained will be referred to as a malfunction. From the differences in waveforms described above, a determination can be made as to whether a problem such as a short circuit in the power supply is caused by moisture penetrating the electronic component mounting substrate 1.

FIG. 12 shows a result of the test performed, after the immersion, for checking the operation of the Hall elements 3a by varying the material and method for forming the surfaces coating on the substrate 2 and the lead wires 5, the coating film thickness, and the conditions of preheating. In FIG. 12, "NORMAL" indicates that the test result is a normal operation, "UNSTABLE" indicates that the test result is an unstable operation, and "MALFUNCTION" indicates that the test result is a malfunction. Note that all the outputs from the Hall elements 3a before the immersion were normal.

Despite the preheating, a malfunction occurred when poly-para-chloro-xylylene was used as a coating material and the deposited film thickness was 4 μm. Despite the deposited film thickness of 15 μm, a malfunction occurred when no preheating was performed. A malfunction was avoided when the deposited film thickness was 15 μm and preheating was performed for 5 minutes. A normal operation was performed when the deposited film thickness was 15 μm and preheating was performed at a temperature of 100 degrees C. or 120 degrees C. for 5 minutes. Therefore, it is particularly preferable that these conditions be used in manufacture. The greater deposited film thickness is thought to increase the coating effect. A malfunction occurred when the deposited film thickness was 4 μm, and thus it is preferable that the deposited film thickness be 5 μm or more.

When a liquid epoxy resin was used as a coating material, a malfunction occurred regardless of whether preheating was performed. A film of liquid epoxy resin was applied to the surface of the substrate 2 with a brush. When the liquid epoxy resin was used, a malfunction occurred despite the relatively large film thickness of 200 μm. This is probably because the liquid resin coating was damaged by the resin pressure during molding of the encapsulation resin 7 and defects were produced in the film.

As described above, in the electronic component mounting substrate 1 of Embodiment 1, the entire surface of at least the part of each lead wire 5, the part being encapsulated by the encapsulation resin 7, and the surface of the substrate 2 are coated with the deposited film 6. With this configuration, even when moisture enters through gaps in the interface between the lead wires 5 and the encapsulation resin 7, the coating effect of the deposited film 6 allows normal operation of each electronic component 3 and an electronic circuit formed by the electronic component 3 and the conductive wires patterned on the surface of the substrate 2. That is, the electronic component mounting substrate 1 can operate properly even when used in a high-humidity environment. Since the coating on the substrate 2 and each lead wire 5 is formed by resin deposition, not by brush coating of liquid resin, a defect-free coating film with a uniform thickness can be obtained. This configuration can provide a high coating effect. It was confirmed that a high coating effect can be achieved when a poly-para-xylylene resin, particularly poly-para-chloro-xylylene, is used to form a deposited film 6. A thin film of such a resin has the advantage of higher flexibility than a liquid resin coating and is particularly preferable as a material of the deposited film 6, because the coating film is resistant to damage caused by concentration of stress on a portion where the lead wires 5 are not firmly fixed, such as a substrate mounted portion of the lead wires 5.

By using a deposition method as a coating technique, the total thickness W (see FIG. 1) of both the deposited film 6 and the encapsulation resin 7 on each measuring element, such as the Hall element 3a, can be reduced. To prevent erroneous measurement, the total thickness W preferably ranges from 15 μm to 1 mm. When the total thickness W including the thickness of the encapsulation resin 7 has the above-described range, the thickness of the deposited film 6 preferably ranges from 5 μm to 150 μm for a better coating effect. This thickness in the electronic component mounting substrate 1 according to the present invention can prevent erroneous measurement by the measuring element, such as the Hall element 3a. In the motor 20 including the electronic component mounting substrate 1, when the Hall elements 3a measure magnetism for controlling the rotation of the rotor 21, the Hall elements 3a and the rotor 21 can be arranged close to each other as illustrated in FIG. 9B because of the thickness described above. This configuration allows the motor 20 to operate properly.

Embodiment 2

Figure 13:
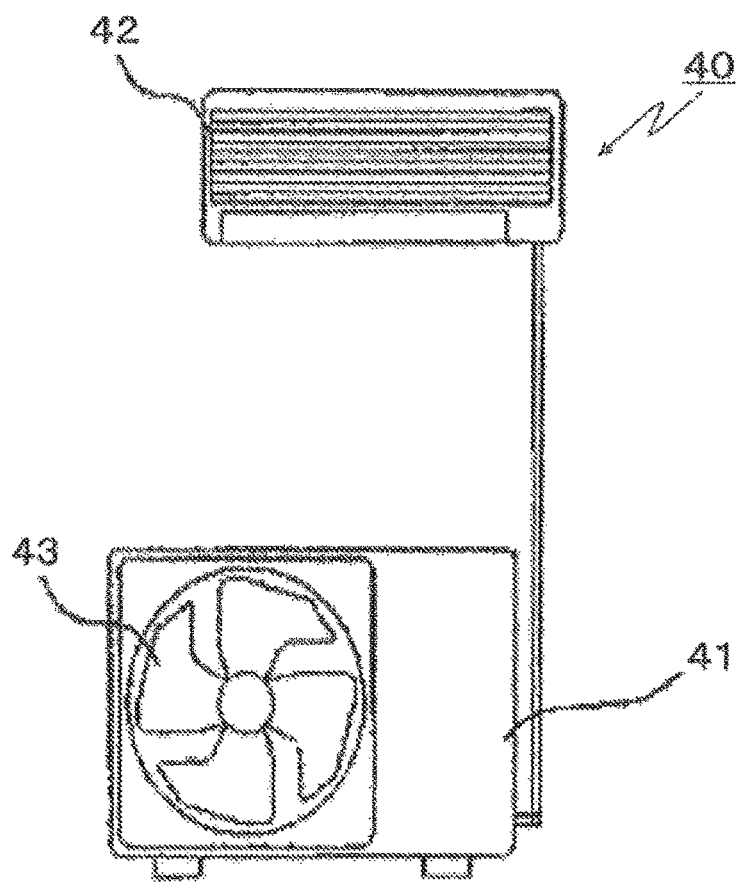
FIG. 13 illustrates an air-conditioning apparatus including the motor illustrated in FIG. 9A.

FIG. 13 illustrates an air-conditioning apparatus 40 including the motor 20. The air-conditioning apparatus 40 includes an outdoor unit 41 and an indoor unit 42 connected to the outdoor unit 41. The outdoor unit 41 and the indoor unit 42 each include an evaporator, a condenser, a compressor, and an expansion mechanism (not shown), which form a refrigeration cycle. The outdoor unit 41 includes a fan 43. The fan 43 includes the motor 20 of Embodiment 1.

Since the air-conditioning apparatus 40 of Embodiment 2 includes the motor 20, the air-conditioning apparatus 40 can be operated properly even when used in a high-humidity environment. The motor 20 is applicable not only to the air-conditioning apparatus 40, but also to various devices, such as a heat pump device (not shown), and can achieve similar effects.

REFERENCE SIGNS LIST 1 electronic component mounting substrate 2 substrate 3 electronic component 3a Hall element 4 electrode portion 4a through hole 4b metal foil pattern 5 lead wire 5a connector 5b external connection terminal
5c electrode-portion connection terminal 5d solder joint 6 deposited film 7 encapsulation resin 8 lead bushing 9 substrate fixing member 10 stator 10a lead-wire attached stator 10b molded stator 11 stator core 12 insulator 13 winding 14 protrusion 15 inner opening 16 inner cylindrical portion 20 motor 21 rotor 22 bearing 23 mounting foot 30 immersion apparatus 31 electrolytic solution 32 container 33 vacuum desiccator 34 valve 35 vacuum pump 40 air-conditioning apparatus 41 outdoor unit 42 indoor unit 43 fan

The invention claimed is:

1. An electronic component mounting substrate comprising:
   a substrate formed with a through hole and including a first surface and a second surface that is opposite to the first surface,
   an electronic component mounted on the first surface of a substrate;
   an electrode portion disposed on the second surface of the substrate and electrically connected to the electronic component;
   a lead wire connected to the electrode portion;
   an encapsulation resin completely surrounding the substrate, the electronic component, the electrode portion, a part of the lead wire connected to the electrode portion, and
   a coating of a deposited film provided on a surface of the part of the lead wire and the surface of the substrate and underneath the encapsulation resin and completely covering the substrate and the part of the lead wire connected to the electrode portion,
   wherein an end of the lead wire is positioned at the second surface and connected to the electrode portion via the through hole.

2. The electronic component mounting substrate of claim 1, wherein the deposited film is of a resin.

3. The electronic component mounting substrate of claim 2, wherein the resin is a poly-para-xylylene resin.

4. The electronic component mounting substrate of claim 3, wherein the poly-para-xylylene resin is a poly-para-chloro-xylylene resin.

5. The electronic component mounting substrate of claim 1, wherein a thickness of the deposited film ranges from 5 μm to 150 μm.

6. A motor comprising the electronic component mounting substrate of claim 1.

7. An air-conditioning apparatus comprising the motor of claim 6.

8. The electronic component mounting substrate of claim 1, wherein
   the substrate and the lead wire are heated after forming the coating of the deposited film on the surface of the lead wire and the surface of the substrate, and
   a thickness of the deposited film ranges from 5 μm to 15 μm.

9. A method for manufacturing an electronic component mounting substrate comprising:
   preparing a substrate having an electronic component and an electrode portion mounted on a surface thereof, the electrode portion being electrically connected to the electronic component, the substrate being provided with a lead wire connected at one end thereof to the electrode portion;
   forming a deposited film completely covering the surface of the substrate and a surface of the lead wire;
   preheating the deposited film covering the surface of the substrate and the surface of the lead wire; and
   encapsulating by completely surrounding the surface of the substrate and the lead wire in a resin.

10. The method for manufacturing an electronic component mounting substrate of claim 9, further comprising preheating the substrate and the lead wire between the forming of the deposited film and the encapsulating of the surfaces in a resin wherein a thickness of the deposited film ranges from 5 μm to 15 μm.

11. The method for manufacturing an electronic component mounting substrate of claim 10, wherein the preheating is carried out at a temperature of 100° C. or 120° C. for 5 minutes.

12. An electronic component mounting substrate comprising:

a substrate formed with a through hole and including a first surface and a second surface that is opposite to the first surface, an electronic component mounted on the first surface of a substrate;

an electrode portion disposed on the second surface of the substrate and electrically connected to the electronic component;

a lead wire connected to the electrode portion; and an encapsulation resin completely surrounding the substrate, the electronic component, the electrode portion, a part of the lead wire connected to the electrode portion, and a coating of a deposited film provided on a surface of the part of the lead wire and the surface of the substrate and underneath the encapsulation resin and completely covering the substrate and the part of the lead wire connected to the electrode portion, wherein at least the substrate and the lead wire are preheated at a temperature and for an amount of time before the coating of the deposited film that effectively improves curing of the coating of the deposited film, and wherein an end of the lead wire is positioned at the second surface and connected to the electrode portion via the through hole.

* * * * *